(12) United States Patent
Fukuoka et al.

(10) Patent No.: US 11,613,794 B2
(45) Date of Patent: *Mar. 28, 2023

(54) SUPERCONDUCTIVITY STABILIZING MATERIAL, SUPERCONDUCTING WIRE AND SUPERCONDUCTING COIL

(71) Applicant: MITSUBISHI MATERIALS CORPORATION, Tokyo (JP)

(72) Inventors: Kosei Fukuoka, Kitamoto (JP); Yuki Ito, Saitama (JP); Kazunari Maki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 335 days.

This patent is subject to a terminal disclaimer.

(21) Appl. No.: 16/758,302

(22) PCT Filed: Oct. 30, 2018

(86) PCT No.: PCT/JP2018/040275
§ 371 (c)(1),
(2) Date: Apr. 22, 2020

(87) PCT Pub. No.: WO2019/088080
PCT Pub. Date: May 9, 2019

(65) Prior Publication Data
US 2020/0340079 A1    Oct. 29, 2020

(30) Foreign Application Priority Data

Oct. 30, 2017 (JP) .............................. JP2017-209207

(51) Int. Cl.
*C22C 9/00*    (2006.01)
*H01B 12/02*   (2006.01)
*H01F 6/06*    (2006.01)

(52) U.S. Cl.
CPC ............... *C22C 9/00* (2013.01); *H01B 12/02* (2013.01); *H01F 6/06* (2013.01)

(58) Field of Classification Search
CPC ..................................... C22C 9/00; H01B 6/06
(Continued)

(56) References Cited

U.S. PATENT DOCUMENTS

| 4,233,067 A | 11/1980 | Sawada |
| 10,964,454 B2 * | 3/2021 | Fukuoka ............. H01L 39/2403 |
| 2006/0016528 A1 | 1/2006 | Hatakeyama |

FOREIGN PATENT DOCUMENTS

| CN | 1080779 A | 1/1994 |
| CN | 1800426 A | 7/2006 |

(Continued)

OTHER PUBLICATIONS

International Search Report dated Feb. 5, 2019 for the corresponding PCT International Patent Application No. PCT/JP2018/040275.
(Continued)

*Primary Examiner* — Weiping Zhu
(74) *Attorney, Agent, or Firm* — Leason Ellis LLP; Melvin C. Garner; Mitsuhiro Haraguchi

(57) ABSTRACT

A superconductivity stabilizing material used for a superconducting wire and which is formed of a copper material containing at least one of additive elements selected from Ca, Sr, Ba, and rare earth elements in a range of 3 ppm by mass or more and 100 ppm by mass or less in total, with a remainder being Cu and unavoidable impurities, in which the total concentration of the unavoidable impurities, excluding O, H, C, N, and S which are gas components, is 5 ppm by mass or more and 100 ppm by mass or less, the half-softening temperature thereof is 200° C. or lower, the Vickers hardness thereof is 55 Hv or more, and the residual resistance ratio (RRR) thereof is 50 or more and 500 or less.

6 Claims, 5 Drawing Sheets

(58) Field of Classification Search
USPC .......................................................... 335/216
See application file for complete search history.

(56) References Cited

FOREIGN PATENT DOCUMENTS

| CN | 101512829 A | 8/2009 |
| CN | 103608910 A | 2/2014 |
| CN | 105540553 A | 5/2016 |
| CN | 107002180 A | 8/2017 |
| EP | 3243916 A1 | 11/2017 |
| JP | 54-097528 A | 8/1979 |
| JP | 63-140052 A | 6/1988 |
| JP | 05-025565 A | 2/1993 |
| JP | 2011-236484 A | 11/2011 |
| JP | 2013-216973 A | 10/2013 |
| JP | 2014-051709 A | 3/2014 |
| JP | 2014143056 A | 8/2014 |
| JP | 2016-125115 A | 7/2016 |
| WO | WO-2016/111159 A1 | 7/2016 |
| WO | WO-2017/175713 A1 | 10/2017 |
| WO | WO-2018/037840 A1 | 3/2018 |

OTHER PUBLICATIONS

Chinese Office Action dated Mar. 30, 2021 for the corresponding Chinese Patent Application No. 201880069609.0.
European Search Report dated Jul. 12, 2021 for the corresponding European Patent Application No. 18872227.6.
Heck S et al., "The RRR of the Cu components of the LHC main bus bar splices", Jan. 18, 2010, XP055819575, Retrieved from the Internet: URL:http://cdsweb.cern.ch/record/1233953/files/Tech%20Note%202010%20005.pdf (retrieved on Jun. 30, 2021).
Zhou Shanyou, "Heat treatment of copper alloys", Shanghai Metals (nonferrous metals), May 1, 1985, pp. 50-53, vol. 6, No. 2 ( No English translation submitted. See the attached IDS Transmittal item No. 3 for relevancy).
Chinese Office Action dated Oct. 8, 2021 for the corresponding Chinese Patent Application No. 201880069609.0.
Korean Office Action dated Oct. 21, 2022 for the corresponding Korean Patent Application No. 10-2020-7008278 (10 pages including English translation).

* cited by examiner

SUPERCONDUCTIVITY STABILIZING MATERIAL, SUPERCONDUCTING WIRE AND SUPERCONDUCTING COIL

CROSS-REFERENCE TO RELATED PATENT APPLICATIONS

This application is a U.S. National Phase Application under 35 U.S.C. § 371 of International Patent Application No. PCT/JP2018/040275 filed Oct. 30, 2018 and claims the benefit of priority to Japanese Patent Application No. 2017-209207 filed Oct. 30, 2017, all of which are incorporated herein by reference in their entirety. The International Application was published in Japanese on May 9, 2019 as International Publication No. WO/2019/088080 under PCT Article 21(2).

FIELD OF THE INVENTION

The present invention relates to a superconductivity stabilizing material used for a superconducting wire, a superconducting wire provided with this superconductivity stabilizing material, and a superconducting coil formed of this superconducting wire.

BACKGROUND OF THE INVENTION

Superconducting wires are, for example, used in fields such as MRI, NMR, particle accelerators, maglev, and power storage apparatuses. These superconducting wires have a multi-core structure in which a plurality of strands consisting of a superconducting material such as Nb—Ti alloy or $Nb_3Sn$ are bundled with a superconductivity stabilizing material interposed therebetween. Tape-shaped superconducting wires in which a superconducting material and a superconductivity stabilizing material are laminated are also available. In order to further improve stability and safety, superconducting wires including a channel member consisting of pure copper are also available.

In the superconducting wire described above, in a case where the superconducting state is destroyed in a part of the superconducting material, the resistance increases greatly at that part, and thereby, the temperature of the superconducting material increases, and there is a concern that the entire superconducting material may exceed the critical temperature and transition to a normal conducting state. Therefore, the inside of the superconducting wire is structured such that a superconductivity stabilizing material having a comparatively low resistance such as copper is arranged so as to be in contact with the superconducting material, and, in the case where the superconducting state is partially destroyed, the current flowing through the superconducting material is temporarily diverted to the superconductivity stabilizing material and the superconducting material is cooled to return to the superconducting state in the meantime.

This type of superconducting wire has strands including a superconducting material represented by Nb—Ti or $Nb_3Sn$ alloy and a superconductivity stabilizing material made of a copper material processed so as to come into contact with the strands, for which processing is carried out such that the strands including a plurality of superconducting materials and the superconductivity stabilizing material form one structural body. The processing is performed by methods including extrusion, rolling, wire drawing, drawing, and twisting.

Of the superconductivity stabilizing material described above, in order to efficiently divert the current, it is required that the resistance at extremely low temperatures be sufficiently low. Residual resistance ratio (RRR) is widely used as an indicator of electric resistance at extremely low temperatures. The residual resistance ratio (RRR) is the ratio $\rho_{293K}/\rho_{4.2K}$ of the resistivity $\rho_{293K}$ at room temperature (293 K) to the resistivity $\rho_{4.2K}$ at the temperature of liquid helium (4.2 K), and the higher the residual resistance ratio (RRR) is, the greater the superconductivity stabilizing material performance is exhibited.

Examples of a copper material having a high residual resistance ratio (RRR) include an ultra-high purity copper (6NCu) having a purity of 99.9999 mass % or more with impurity elements reduced to the minimum, and the like.

Japanese Unexamined Patent Application, First Publication No. 2011-236484 proposes a high-purity copper having an extremely low impurity concentration for which the content of specific elements (Fe, P, Al, As, Sn, and S) is defined.

Japanese Unexamined Patent Application, First Publication No. H05-025565 proposes a Cu alloy obtained by adding a small amount of Zr to high-purity copper having a low oxygen concentration.

However, with ultra-high purity copper where impurity elements are reduced to the minimum, there are problems in that the manufacturing process for increasing the purity of the copper is extremely complicated and the manufacturing costs increase significantly.

In Japanese Unexamined Patent Application, First Publication No. 2011-236484, the content of the specific elements (Fe, P, Al, As, Sn and S) are limited to less than 0.1 ppm; however, it is not easy to reduce the amounts of these elements to less than 0.1 ppm and the problem of the manufacturing process being complicated remains.

Although the content of oxygen and Zr is defined in Japanese Unexamined Patent Application, First Publication No. H05-025565, there are problems in that it is difficult to control the content of oxygen and Zr and it is difficult to stably manufacture a copper alloy having a high residual resistance ratio (RRR).

Japanese Unexamined Patent Application, First Publication No. 2016-125115 proposes a technique for obtaining a copper material in which the residual resistance ratio (RRR) is sufficiently high by adding at least one of additive elements selected from Ca, Sr, Ba, and rare earth elements, without needing to increase the purity more than necessary.

Technical Problem

Here, the superconductivity stabilizing material described above has deformed grain structures due to substantial deformation of the superconducting wire and the like in the wire drawing process, such that lattice defects such as dislocations are greatly increased and, as a result, the resistance may increase and the residual resistance ratio (RRR) may decrease. For this reason, it is necessary to restore the residual resistance ratio (RRR) by performing a heat treatment after the processing to sufficiently reduce lattice defects in the matrix as a recrystallized structure.

For example, with Nb—Ti-based superconducting materials, if the heat treatment temperature is excessively high, there is a concern that the characteristics of the superconducting materials may deteriorate due to recrystallization, thus, the heat treatment may be performed under low temperature conditions such as 200° C. or lower. For the superconductivity stabilizing material described above, it is desirable for lattice defects in the matrix to be sufficiently reduced even under low temperature conditions of 200° C. or lower, that is, a material with a low recrystallization temperature.

Recently, there has been a demand for the use of superconducting wires at a higher magnetic field force than in the related art. In a case of being used in an environment with a high magnetic field, the superconducting wire moves slightly and vibrates, generating frictional heat, in which there is a concern that the superconducting state may be destroyed. For this reason, for a superconductivity stabilizing material used in a high magnetic field environment, there is a demand for high hardness such that vibration is not generated, even in a high magnetic field environment.

The present invention was made in view of the circumstances described above and has an object of providing a superconductivity stabilizing material which has low recrystallization temperature and high hardness and which is suitable for use in an environment with a high magnetic field, a superconducting wire provided with this superconductivity stabilizing material, and a superconducting coil formed of this superconducting wire.

SUMMARY OF THE INVENTION

Solution to Problem

A superconductivity stabilizing material of the present invention is a superconductivity stabilizing material which is used for a superconducting wire and which is formed of a copper material containing at least one of additive elements selected from Ca, Sr, Ba, and rare earth elements in a range of 3 ppm by mass or more and 100 ppm by mass or less in total, with a remainder being Cu and unavoidable impurities, in which a total concentration of the unavoidable impurities, excluding O, H, C, N, and S which are gas components, is 5 ppm by mass or more and 100 ppm by mass or less, a half-softening temperature of 200° C. or lower, a Vickers hardness of 55 Hv or more, and a residual resistance ratio (RRR) of 50 or more and 500 or less.

According to the superconductivity stabilizing material having the configuration described above, since the copper material contains at least one of additive elements selected from Ca, Sr, Ba, and rare earth elements in a range of 3 ppm by mass or more and 100 ppm by mass or less in total, S, Se, and Te in the copper are fixed as a compound and it is possible to improve the residual resistance ratio (RRR).

In addition, since the total concentration of the unavoidable impurities, excluding O, H, C, N, and S which are gas components, is 5 ppm by mass or more and 100 ppm by mass or less, it is not necessary to excessively increase the purity of copper, the manufacturing process is simple, and it is possible to reduce the manufacturing costs.

In the superconductivity stabilizing material of the present invention, since the half-softening temperature is 200° C. or lower, even in a case where a heat treatment is performed under low temperature conditions of 200° C. or lower, it is possible to sufficiently reduce lattice defects in the matrix due to recrystallization and to sufficiently restore the residual resistance ratio (RRR).

Furthermore, since the Vickers hardness is 55 Hv or more, even in a case of being used in an environment with a high magnetic field, it is possible to suppress the superconducting wire from vibrating and to suppress the generation of frictional heat.

In addition, since the residual resistance ratio (RRR) is 50 or more and 500 or less, the resistance value at extremely low temperatures is sufficiently low, and it is possible to sufficiently divert the current when the superconducting state of the superconducting material is destroyed, making it particularly excellent as a superconductivity stabilizing material.

In the superconductivity stabilizing material of the present invention, as the unavoidable impurities, it is preferable that the content of Fe is 10 ppm by mass or less, the content of Ni is 10 ppm by mass or less, the content of As is 5 ppm by mass or less, the content of Ag is 50 ppm by mass or less, the content of Sn is 4 ppm by mass or less, the content of Sb is 4 ppm by mass or less, the content of Pb is 6 ppm by mass or less, the content of Bi is 2 ppm by mass or less, and the content of P is 3 ppm by mass or less. Among unavoidable impurities, specific impurity elements such as Fe, Ni, As, Ag, Sn, Sb, Pb, Bi, and P have an effect of decreasing the residual resistance ratio (RRR). Defining the amount of these elements as described above makes it possible to reliably improve the residual resistance ratio (RRR).

In the superconductivity stabilizing material of the present invention, a ratio Y/X of the total content (Y ppm by mass) of at least one of additive elements selected from Ca, Sr, Ba, and rare earth elements to the total content (X ppm by mass) of S, Se, and Te is preferably in a range of $0.5 \leq Y/X \leq 20$. In this case, since the ratio Y/X of the total content (Y ppm by mass) of at least one of additive elements selected from Ca, Sr, Ba, and rare earth elements to the total content (X ppm by mass) of S, Se, and Te is in the range described above, it is possible to reliably fix S, Se, and Te in the copper as compounds and to reliably suppress decreases in the residual resistance ratio (RRR) caused by S, Se, and Te.

In the superconductivity stabilizing material of the present invention, it is preferable that at least one compound including at least one of additive elements selected from Ca, Sr, Ba, and rare earth elements and at least one of elements selected from S, Se, and Te is present. In such a case, S, Se, and Te present in the copper are reliably fixed as a compound with at least one of additive elements selected from Ca, Sr, Ba, and rare earth elements and it is possible to reliably suppress decrease in the residual resistance ratio (RRR) caused by S, Se, and Te.

A superconducting wire of the present invention includes a strand including a superconducting material and the superconductivity stabilizing material described above. Since this superconducting wire is provided with a superconductivity stabilizing material which has a high residual resistance ratio (RRR) and high hardness as described above, even in a case where the superconducting state of the superconducting material is destroyed, it is possible to reliably divert the current flowing through the superconducting material to the superconductivity stabilizing material and to suppress the normal conducting state from propagating throughout the superconducting material. Even in a case of being used in an environment with a high magnetic field, it is possible to suppress the superconducting wire from vibrating and to suppress the generation of frictional heat.

A superconducting coil of the present invention has a structure provided with a winding section in which the superconducting wire described above is wound around a peripheral surface of a winding frame. In this superconducting coil, as described above, since a superconducting wire provided with a superconductivity stabilizing material which has a high residual resistance ratio (RRR) and a high hardness is used, stable use is possible. Even in a case of being used in an environment with a high magnetic field, it is possible to suppress the superconducting wire from vibrating and to suppress the generation of frictional heat.

Advantageous Effects of Invention

According to the present invention, it is possible to provide a superconductivity stabilizing material which has low recrystallization temperature and high hardness and which is suitable for use in an environment with a high magnetic field, a superconducting wire provided with this superconductivity stabilizing material, and a superconducting coil formed of this superconducting wire.

DETAILED DESCRIPTION OF THE INVENTION

A description will be given below of a superconductivity stabilizing material 20 and a superconducting wire 10, which are one embodiment of the present invention, with reference to the accompanying drawings.

Figure 1:
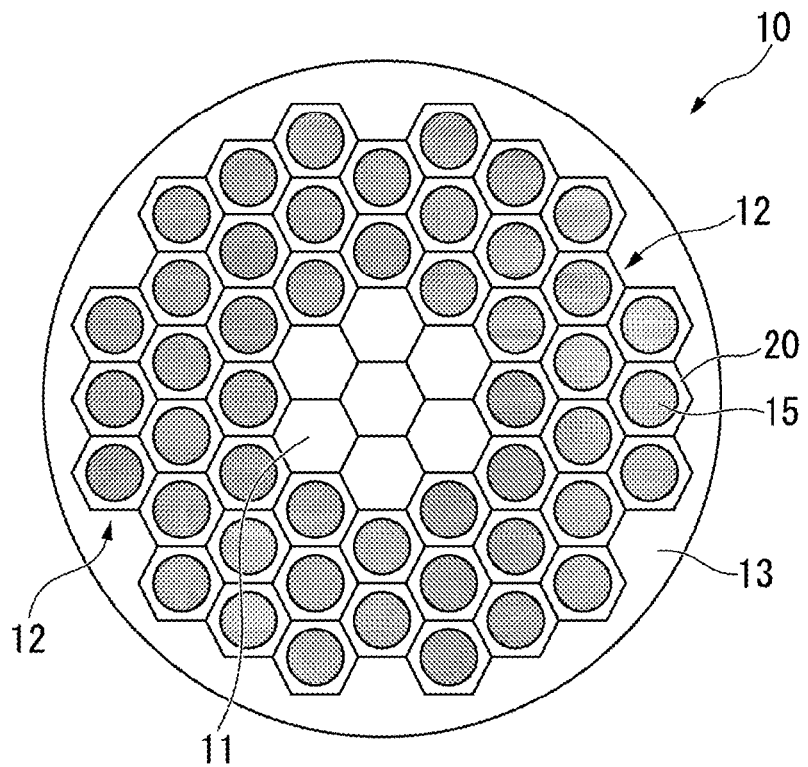
FIG. 1 is a cross-sectional view of a superconducting wire provided with a superconductivity stabilizing material which is an embodiment of the present invention.

As shown in FIG. 1, the superconducting wire 10 in the present embodiment is provided with a core section 11, a plurality of filaments 12 arranged on the outer peripheral side of the core section 11, and a shell section 13 arranged on the outer peripheral side of the plurality of the filaments 12.

Figure 2:
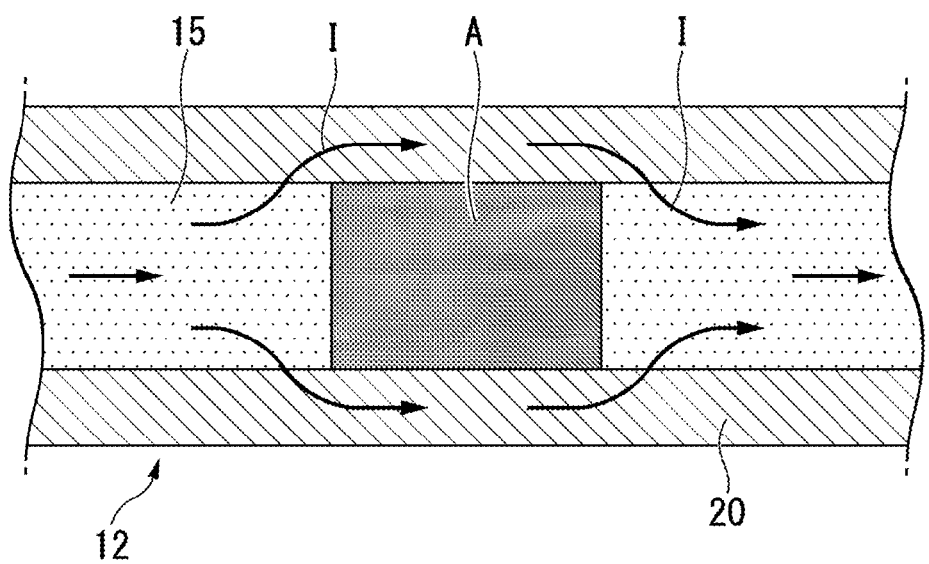
FIG. 2 is a longitudinal sectional view of a filament used in the superconducting wire shown in FIG. 1.

The filament 12 has a structure in which strands 15 formed of a superconducting material are covered with the superconductivity stabilizing material 20, as shown in FIG. 1 and FIG. 2. In this example, each strand 15 has a circular cross section with the same diameter, and the superconductivity stabilizing material 20 surrounds each of the strands 15 in cylindrical form. The cross-section of the superconductivity stabilizing material 20 has a regular hexagonal shape with the same diameter. The core section 11 in this example is formed of a plurality of core strands. Each core strand has a hexagonal cross-sectional shape, which is substantially the same as that of the filament 12, and the core strands are arranged without gaps therebetween. The shell section 13 surrounds the assembly of the core section 11 and the filament 12 to be concentric with the assembly, and has a circular cross section. However, the present invention is not limited to the shape of this example.

As shown in FIG. 2, in a case where the superconducting state is destroyed in part of the strand 15 consisting of a superconducting material such that a normal conducting region A is generated, a current I flowing through the strand 15 consisting of a superconducting material is temporarily diverted to the superconductivity stabilizing material 20. The core section 11 and the shell section 13 may also have the above-described role as the superconductivity stabilizing material. In such a case, it is also preferable to use the superconductivity stabilizing material of the present invention for the core section 11 and the shell section 13. In a case where the superconducting stabilization effect is not required for the core section 11 and the shell section 13, the above may be formed of other conductive materials such as a typical high-purity copper.

The superconductivity stabilizing material 20 and the core section 11 and the shell section 13 in a case of having a role as a superconductivity stabilizing material are formed of a copper material with a structure containing at least one of additive elements selected from Ca, Sr, Ba, and rare earth elements in a range of 3 ppm by mass or more and 100 ppm by mass or less in total, with the remainder being Cu and unavoidable impurities.

In the superconductivity stabilizing material 20 and the core section 11 and the shell section 13 in a case of having a role as a superconductivity stabilizing material, the total concentration of unavoidable impurities, excluding O, H, C, N, and S which are gas components, is 5 ppm by mass or more and 100 ppm by mass or less.

The superconductivity stabilizing material 20 and the core section 11 and the shell section 13 in a case of having a role as a superconductivity stabilizing material have characteristics in which the half-softening temperature is 200° C. or less, the Vickers hardness is 55 Hv or more, and the residual resistance ratio (RRR) is 50 or more and 500 or less.

More preferably, for the superconductivity stabilizing material 20 and the core section 11 and the shell section 13 in a case of having a role as a superconductivity stabilizing material, as the unavoidable impurities, the content of Fe may be 10 ppm by mass or less, the content of Ni may be 10 ppm by mass or less, the content of As may be 5 ppm by mass or less, the content of Ag may be 50 ppm by mass or less, the content of Sn may be 4 ppm by mass or less, the content of Sb may be 4 ppm by mass or less, the content of Pb may be 6 ppm by mass or less, the content of Bi may be 2 ppm by mass or less, and the content of P may be 3 ppm by mass or less.

More preferably, for the superconductivity stabilizing material 20 and the core section 11 and the shell section 13 in a case of having a role as a superconductivity stabilizing material, a ratio Y/X of the total content (Y ppm by mass) of at least one of additive elements selected from Ca, Sr, Ba, and rare earth elements to the total content (X ppm by mass) of S, Se, and Te may be in a range of $0.5 \leq Y/X \leq 20$.

For the superconductivity stabilizing material 20 and the core section 11 and the shell section 13 in a case of having a role as a superconductivity stabilizing material, a compound including at least one of additive elements selected from Ca, Sr, Ba, and rare earth elements and at least one of elements selected from S, Se, and Te is present.

A description will be given below of the reasons for defining the component composition, the half-softening temperature, the hardness, and the presence or absence of the residual resistance ratio (RRR) compound as described above.

(At Least One of Additive Elements Selected from Ca, Sr, Ba, and Rare Earth Elements)

Among the unavoidable impurities included in copper, S, Se, and Te are elements which are dissolved in the copper so as to greatly decrease the residual resistance ratio (RRR). Therefore, in order to improve the residual resistance ratio (RRR), it is necessary to remove the influence of the S, Se, and Te.

Since at least one of additive elements selected from Ca, Sr, Ba, and rare earth elements are elements which are highly reactive with S, Se, and Te, the additive elements described above form a compound with S, Se, and Te and, due to this, it is possible to suppress the S, Se, and Te from being dissolved in the copper. Due to this, it is possible to sufficiently improve the residual resistance ratio (RRR) of the superconductivity stabilizing material 20 and the core section 11 and the shell section 13 in a case of having a role as a superconductivity stabilizing material.

At least one of additive elements selected from Ca, Sr, Ba, and rare earth elements are elements which do not easily dissolve in copper and which have a small effect of decreasing the residual resistance ratio (RRR) even when the additive elements dissolve in the copper, thus, the residual resistance ratio (RRR) of superconductivity stabilizing material 20 and the core section 11 and the shell section 13 in a case of having a role as a superconductivity stabilizing material does not decrease greatly even in a case where the additive elements are added in an excessive amount with respect to the content of S, Se, and Te.

When the content of at least one of additive elements selected from Ca, Sr, Ba, and rare earth elements is less than 3 ppm by mass, there is a concern that it will not be possible to sufficiently achieve the effect of fixing the S, Se, and Te. On the other hand, in a case where the content of at least one of additive elements selected from Ca, Sr, Ba, and rare earth elements exceeds 100 ppm by mass, there is a concern that coarse precipitates or the like of these additive elements will be produced, which deteriorates workability.

From the above-described reasons, in the present embodiment, the content of at least one of additive elements selected from Ca, Sr, Ba, and rare earth elements is defined to be in the range of 3 ppm by mass or more and 100 ppm by mass or less.

In order to reliably fix S, Se, and Te, the lower limit of the content of at least one of additive elements selected from Ca, Sr, Ba, and rare earth elements is preferably set to 3.5 ppm by mass or more, and more preferably set to 4.0 ppm by mass or more. On the other hand, in order to reliably prevent decreases in workability, the upper limit of the content of at least one of additive elements selected from Ca, Sr, Ba, and rare earth elements is preferably 80 ppm by mass or less, more preferably 50 ppm by mass or less, and even more preferably 30 ppm by mass or less.

(Unavoidable Impurity Elements Excluding Gas Components)

The residual resistance ratio (RRR) is improved by lowering the concentrations of unavoidable impurities excluding gas components (O, H, C, N, and S). On the other hand, if the concentration of unavoidable impurities is to be reduced more than necessary, the manufacturing process becomes complex and, due to this, the manufacturing costs significantly increase. Therefore, in the present embodiment, the total concentration of unavoidable impurities excluding gas components (O, H, C, N, and S) is set to be in a range of 5 ppm by mass or more and 100 ppm by mass or less.

In order to set the total concentration of unavoidable impurities excluding the gas components (O, H, C, N, and S) to be in a range of 5 ppm by mass or more and 100 ppm by mass or less, it is possible to use a high-purity copper with a purity of 99 to 99.9999 mass % or oxygen free copper (C10100 and C10200) as the raw material. However, when the concentration of O is high, Ca, Sr, Ba, and rare earth elements will react with O, thus, the O concentration is preferably set to 20 ppm by mass or less, and more preferably 10 ppm by mass or less. 5 ppm by mass or less is even more preferable.

In order to reliably prevent increases in the manufacturing costs, the lower limit of the unavoidable impurities is preferably set to 7 ppm by mass or more, and more preferably set to 10 ppm by mass or more. On the other hand, in order to reliably improve the residual resistance ratio (RRR), the upper limit of the unavoidable impurities is preferably 90 ppm by mass or less, and more preferably 80 ppm by mass or less.

The unavoidable impurities in the present embodiment are Fe, Ni, As, Ag, Sn, Sb, Pb, Bi, P, Li, Be, B, F, Na, Mg, Al, Si, Cl, K, Ti, V, Cr, Mn, Nb, Co, Zn, Ga, Ge, Br, Rb, Zr, Mo, Ru, Pd, Cd, In, I, Cs, Hf, Ta, W, Re, Os, Ir, Pt, Au, Hg, Tl, Th, and U.

(Fe, Ni, as, Ag, Sn, Sb, Pb, Bi, and P)

Among the unavoidable impurities, specific impurity elements such as Fe, Ni, As, Ag, Sn, Sb, Pb, Bi, and P have an effect of decreasing the residual resistance ratio (RRR), thus, the content of each of these elements is defined and, due to this, it is possible to reliably prevent the decrease in the residual resistance ratio (RRR). In the present embodiment, the content of Fe is set to 10 ppm by mass or less, the content of Ni is set to 10 ppm by mass or less, the content of As is set to 5 ppm by mass or less, the content of Ag is set to 50 ppm by mass or less, the content of Sn is set to 4 ppm by mass or less, the content of Sb is set to 4 ppm by mass or less, the content of Pb is set to 6 ppm by mass or less, the content of Bi is set to 2 ppm by mass or less, and the content of P is set to 3 ppm by mass or less.

In order to more reliably prevent decreases in the residual resistance ratio (RRR), the content of Fe is preferably set to 4.5 ppm by mass or less, the content of Ni is preferably set to 3 ppm by mass or less, the content of As is preferably set to 3 ppm by mass or less, the content of Ag is preferably set to 38 ppm by mass or less, the content of Sn is preferably set to 3 ppm by mass or less, the content of Sb is preferably set to 1.5 ppm by mass or less, the content of Pb is preferably set to 4.5 ppm by mass or less, the content of Bi is preferably set to 1.5 ppm by mass or less, and the content of P is preferably set to 1.5 ppm by mass or less, furthermore, the content of Fe is more preferably set to 3.3 ppm by mass or less, the content of Ni is more preferably set to 2.2 ppm by mass or less, the content of As is more preferably set to 2.2 ppm by mass or less, the content of Ag is more preferably set to 28 ppm by mass or less, the content of Sn is more preferably set to 2.2 ppm by mass or less, the content of Sb is more preferably set to 1.1 ppm by mass or less, the content of Pb is more preferably set to 3.3 ppm by mass or less, the content of Bi is more preferably set to 1.1 ppm by mass or less, and the content of P is more preferably set to 1.1 ppm by mass or less.

(Ratio Y/X of Total Content of Additive Elements to Total Content of S, Se, and Te)

As described above, at least one of additive elements selected from Ca, Sr, Ba, and rare earth elements form compounds with elements such as S, Se, and Te. In a case where the ratio Y/X of the total content of the additive elements to the total content of S, Se, and Te is less than 0.5, the content of the additive elements is insufficient and there is a concern that it may not be possible to sufficiently fix the elements such as S, Se, and Te.

On the other hand, in a case where the ratio Y/X of the total content of the additive elements to the total content of S, Se, and Te exceeds 20, a large amount of excess additive elements which do not react with S, Se, and Te may be present and there is a concern that the workability may be deteriorated.

From the above, in the present embodiment, the ratio Y/X of the total content of additive elements to the total content of S, Se, and Te is preferably defined to be in the range of 0.5 or more and 20 or less.

In order to reliably fix the elements such as S, Se, and Te as compounds, the lower limit of the ratio Y/X of the total content of additive elements to the total content of S, Se, and Te is preferably 0.75 or more, and more preferably 1.0 or more. In order to reliably prevent decreases in workability, the upper limit of the ratio Y/X of the total content of additive elements to the total content of S, Se, and Te is preferably 17 or less, and more preferably 11 or less.
(Compound Including Additive Elements and at Least One of Elements Selected from S, Se, and Te)

As described above, at least one of additive elements selected from Ca, Sr, Ba, and rare earth elements form compounds with elements such as S, Se, and Te, such that the elements such as S, Se, and Te are suppressed from dissolving in the copper. Thus, the presence of a compound including at least one of additive elements selected from Ca, Sr, Ba, and rare earth elements and at least one of elements selected from S, Se, and Te makes it possible to reliably improve the residual resistance ratio (RRR).

The compound including at least one of additive elements selected from Ca, Sr, Ba, and rare earth elements and elements such as S, Se, and Te existing in the number density of 0.001 compound/$\mu m^2$ or more makes it possible to reliably improve the residual resistance ratio (RRR). In order to further improve the residual resistance ratio (RRR), the number density of the compound is 0.005 compound/$\mu m^2$ or more, and more preferably 0.007 compound/$\mu m^2$ or more.

In the present embodiment, the number density described above is the target for compounds having a particle size of 0.1 µm or more. In the present embodiment, since the content of elements such as S, Se, and Te is sufficiently small, the upper limit of the number density of the compounds described above (particle size of 0.1 µm or more) is 0.1 compound/$\mu m^2$ or less, and more preferably 0.09 compound/$\mu m^2$ or less. The upper limit is even more preferably 0.08 compound/$\mu m^2$ or less.
(Half-Softening Temperature)

In a superconducting wire provided with a strand formed of an Nb—Ti-based superconducting material, it is preferable to perform a heat treatment under a low temperature condition of 200° C. or lower in order to maintain the characteristics. For this reason, in the superconductivity stabilizing material, it is necessary for recrystallization to sufficiently proceed even under a low temperature condition of 200° C. or lower to reduce lattice defects in the matrix formed during processing and to reduce the resistance value.

In the present embodiment, the half-softening temperature of the superconductivity stabilizing material 20 is 200° C. or lower. The half-softening temperature of the superconductivity stabilizing material 20 is preferably 175° C. or lower, and more preferably 160° C. or lower.

In the present embodiment, the half-softening temperature is defined as follows. The Vickers hardness at room temperature after cold plastic working with an area reduction rate of 50% or more or a rolling rate of 50% or more was set as Hv_(CD). The area reduction rate=(cross-sectional area before wire drawing−cross-sectional area after wire drawing)/(cross-sectional area before wire drawing)×100). The rolling rate=(thickness before rolling−thickness after rolling)/(thickness before rolling)×100). The Vickers hardness measured at room temperature after rapid cooling after holding for one hour in an Ar gas atmosphere at 500° C. was set as Hv_500° C. The heat treatment temperature before rapid cooling when the hardness was Hv_recry=Hv_500° C.+(Hv_(CD)−Hv_500° C.)/2 was set as the half-softening temperature.
(Vickers Hardness)

In a case where the superconducting wire 10 is used in an environment with a high magnetic field, when the mechanical strength of the superconducting wire 10 as a whole is insufficient, the filament 12 (the strands 15, the superconductivity stabilizing material 20, and the core section 11 and the shell section 13 in a case of having a role as a superconductivity stabilizing material) vibrates slightly, and, due to this, there is a concern that frictional heat may be generated and the superconducting state may be destroyed.

In order to ensure the mechanical strength of the superconducting wire 10, the Vickers hardness of the superconductivity stabilizing material 20 and the core section 11 and the shell section 13 in a case of having a role as a superconductivity stabilizing material is defined as 55 Hv or more.

The Vickers hardness of the superconductivity stabilizing material 20 and the core section 11 and the shell section 13 in a case of having a role as a superconductivity stabilizing material is preferably 60 Hv or more, more preferably 62 Hv or more, and even more preferably 65 Hv or more.
(Residual Resistance Ratio (RRR))

In the superconductivity stabilizing material 20 and the core section 11 and the shell section 13 in a case of having a role as a superconductivity stabilizing material, high residual resistance ratio (RRR) is desired in order to properly divert current at a low resistance value at extremely low temperatures. If the residual resistance ratio (RRR) is less than 50, there is a concern that it may not be possible to properly divert the current. On the other hand, in order to set the residual resistance ratio (RRR) to exceed 500, heat treatment at a comparatively high temperature is required and there is a concern that the hardness may be lowered.

From the above, in the present embodiment, the residual resistance ratio (RRR) of the superconductivity stabilizing material 20 and the core section 11 and the shell section 13 in a case of having a role as a superconductivity stabilizing material is set in a range of 50 or more and 500 or less. The lower limit of the residual resistance ratio (RRR) is preferably 100 or more, and more preferably 150 or more. The upper limit of the residual resistance ratio (RRR) is preferably 400 or less, more preferably 350 or less, and even more preferably 250 or less.

The superconductivity stabilizing material 20 and the core section 11 and the shell section 13 in a case of having a role as a superconductivity stabilizing material are manufactured by manufacturing steps including a melting and casting step, a hot working step such as hot extrusion, a plastic working step, a heat treatment step, and a cold plastic working step.

A rough drawn copper wire having the composition shown in the present embodiment may be manufactured by a continuous casting and rolling method (for example, the SCR method) or the like, and the superconductivity stabilizing material 20 and the core section 11 and the shell section 13 in a case of having a role as a superconductivity stabilizing material may be manufactured using this rough drawn copper wire as a base material. In this case, the production efficiency of the superconductivity stabilizing material 20 and the core section 11 and the shell section 13 in a case of having a role as a superconductivity stabilizing material is improved, and it is possible to greatly reduce the manufacturing costs. The continuous casting and rolling method referred to here is a step in which a rough drawn copper wire is manufactured using a continuous casting and rolling facility provided with a belt-wheel type continuous casting apparatus and a continuous rolling device, and a drawn copper wire is manufactured using this rough drawn copper wire as a base material.

According to the superconductivity stabilizing material 20 and the core section 11 and the shell section 13 in a case of having a role as a superconductivity stabilizing material with the configuration described above, since the copper material contains at least one of additive elements selected from Ca, Sr, Ba, and rare earth elements in a range of 3 ppm by mass or more and 100 ppm by mass or less in total, the S, Se, and Te in the copper are fixed as a compound and it is possible to improve the residual resistance ratio (RRR).

Since the total concentration of unavoidable impurities, excluding O, H, C, N, and S which are gas components, is 5 ppm by mass or more and 100 ppm by mass or less, it is not necessary to excessively increase the purity of copper, the manufacturing process is simple, and it is possible to reduce the manufacturing costs.

In the superconductivity stabilizing material 20 and the core section 11 and the shell section 13 in a case of having a role as a superconductivity stabilizing material of the embodiment, since the half-softening temperature is 200° C. or lower, even in a case where a heat treatment is performed under low temperature conditions of 200° C. or lower, it is possible to sufficiently reduce lattice defects in the matrix due to recrystallization and to sufficiently restore the residual resistance ratio (RRR).

In the superconductivity stabilizing material 20 and the core section 11 and the shell section 13 in a case of having a role as a superconductivity stabilizing material of the embodiment, since the Vickers hardness is 55 Hv or more, even in a case of being used in an environment with a high magnetic field, it is possible to suppress the filament 12 (the strands 15, the superconductivity stabilizing material 20, and the core section 11 and the shell section 13 in a case of having a role as a superconductivity stabilizing material) from vibrating and to suppress the generation of frictional heat.

In the superconductivity stabilizing material 20 of the embodiment, since the residual resistance ratio (RRR) is 50 or more and 500 or less, the resistance value at extremely low temperatures is sufficiently low and it is possible to sufficiently divert the current when the superconducting state of the superconducting material is destroyed, making it particularly excellent as the superconductivity stabilizing material 20 and the core section 11 and the shell section 13 in a case of having a role as a superconductivity stabilizing material.

In a preferable example of the present embodiment, the content of Fe, Ni, As, Ag, Sn, Sb, Pb, Bi, and P which influence the residual resistance ratio (RRR) are defined such that the content of Fe is 10 ppm by mass or less, the content of Ni is 10 ppm by mass or less, the content of As is 5 ppm by mass or less, the content of Ag is 50 ppm by mass or less, the content of Sn is 4 ppm by mass or less, the content of Sb is 4 ppm by mass or less, the content of Pb is 6 ppm by mass or less, the content of Bi is 2 ppm by mass or less, and the content of P is 3 ppm by mass or less, thus, it is possible to reliably improve the residual resistance ratio (RRR) of the superconductivity stabilizing material 20 and the core section 11 and the shell section 13 in a case of having a role as a superconductivity stabilizing material.

In a preferable example of the present embodiment, a ratio Y/X of the total content (Y ppm by mass) of at least one of additive elements selected from Ca, Sr, Ba, and rare earth elements to the total content (X ppm by mass) of S, Se, and Te is in the range of $0.5 \leq Y/X \leq 20$, thus, it is possible to reliably fix S, Se, and Te in a copper as compounds with additive elements and to reliably prevent decreases in the residual resistance ratio (RRR). Excess additive elements, which do not react with S, Se, and Te, are not present in large amounts, making it is possible to ensure workability.

In the present embodiment, since a compound including at least one of additive elements selected from Ca, Sr, Ba, and rare earth elements and at least one of elements selected from S, Se, and Te is present, S, Se, and Te present in the copper are reliably fixed by the compound with at least one of additive elements selected from Ca, Sr, Ba and rare earth elements, and it is possible to reliably suppress the decrease in the residual resistance ratio (RRR) due to the S, Se, and Te for the superconductivity stabilizing material 20 and the core section 11 and the shell section 13 in a case of having a role as a superconductivity stabilizing material.

In particular, in a preferable example of the present embodiment, since the number density of the compound, which has a particle size of 0.1 μm or more, is 0.001 compound/μm$^2$ or more, it is possible to reliably fix S, Se, and Te as a compound and to sufficiently improve the residual resistance ratio (RRR) of the superconductivity stabilizing material 20.

Although the superconductivity stabilizing material and superconducting wire, which are embodiments of the present invention, are described above, the present invention is not limited thereto and is able to be appropriately modified in a range not departing from the technical features of the invention.

For example, the core section 11 and the shell section 13 which form the superconducting wire 10 may also be formed of a copper material having the same composition as that of the superconductivity stabilizing material 20.

In the embodiment described above, as shown in FIG. 1, the superconducting wire 10 having a structure in which a plurality of the filaments 12 are bundled is described as an example, without being limited thereto.

Figure 3:
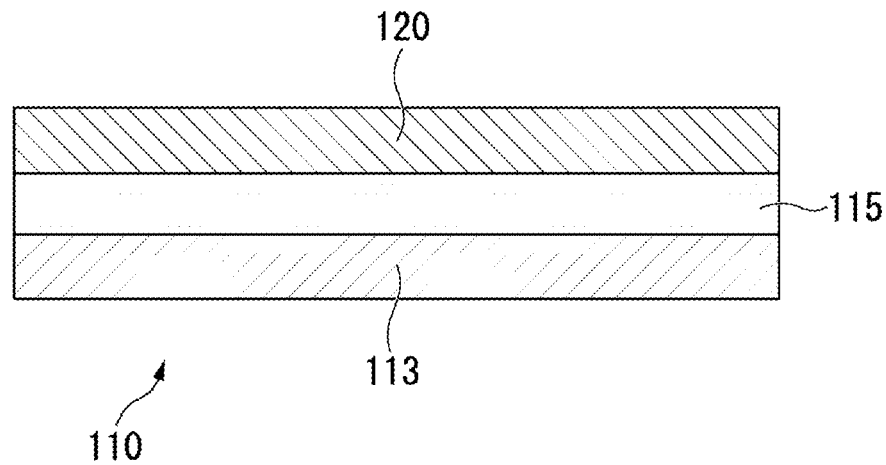
FIG. 3 is a longitudinal sectional view of a superconducting wire provided with a superconductivity stabilizing material which is another embodiment of the present invention.

For example, as shown in FIG. 3, a superconducting wire 110 having a structure in which a superconducting material 115 and a superconductivity stabilizing material 120 are laminated and arranged on a tape-like substrate 113 may be adopted.

Figure 4:
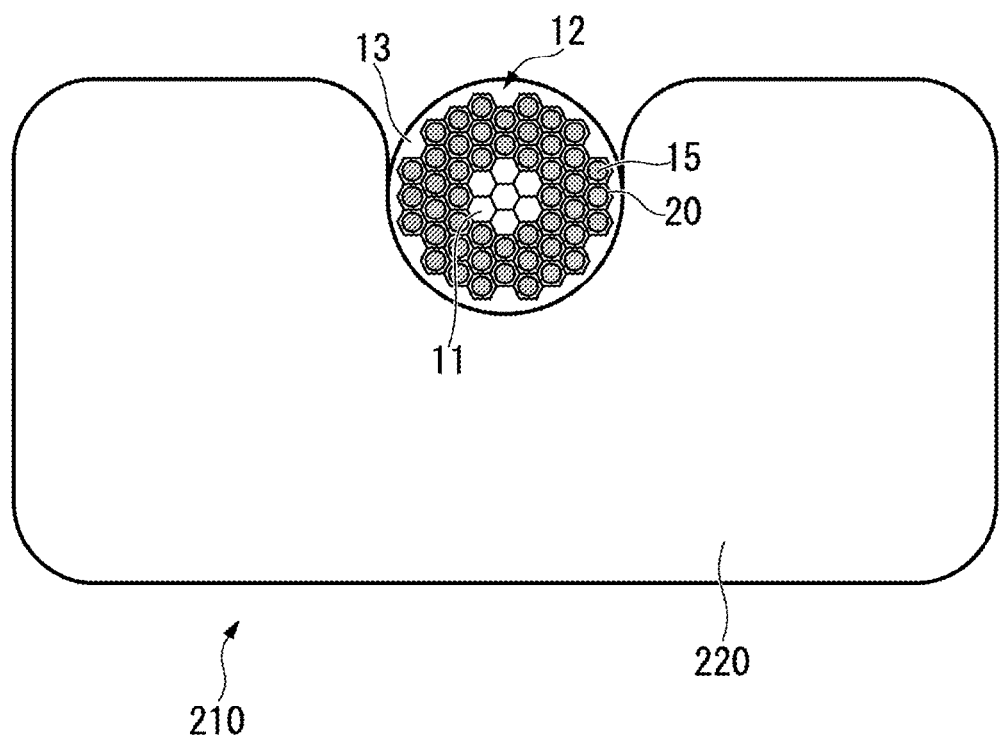
FIG. 4 is a cross-sectional view of a superconducting wire provided with a superconductivity stabilizing material which is another embodiment of the present invention and a channel member.

As shown in FIG. 4, a superconducting wire 210 having a structure in which a plurality of the filaments 12 are bundled and then assembled in a channel member 220 consisting of pure copper may be adopted. In such a case, the channel member 220 also has a role as a superconductivity stabilizing material.

Figure 7:
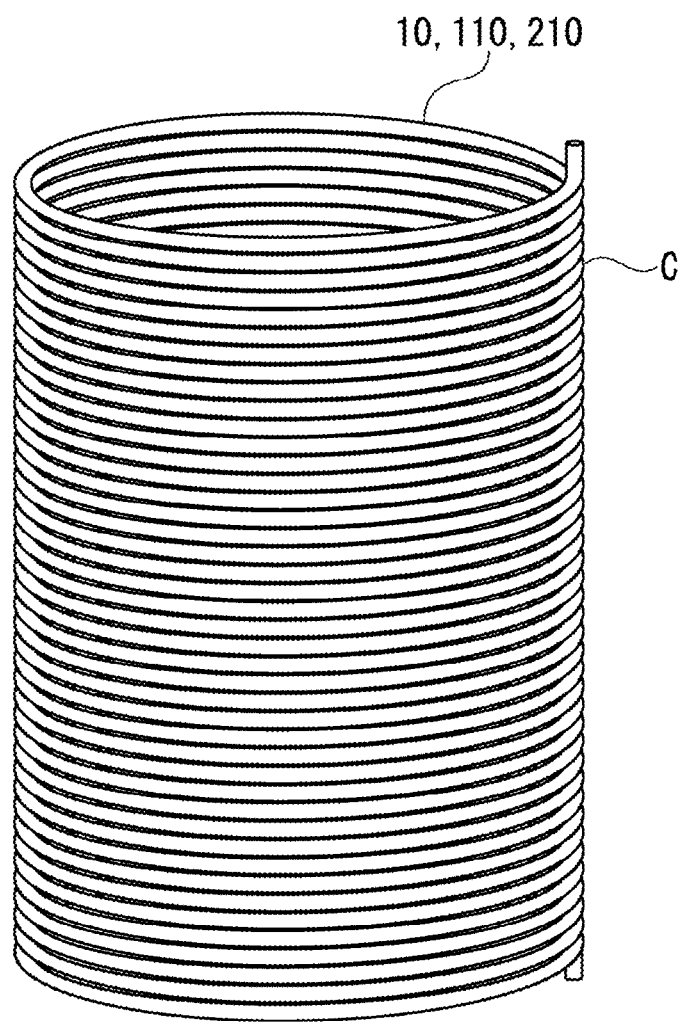
FIG. 7 is a perspective view showing a superconducting coil which is an embodiment of the present invention.

FIG. 7 is of a coil C in which the superconducting wire of the present invention, for example, the superconducting wires 10, 110, and 210 are wound in a spiral. The coil C in this example has a circular cross section, is wound with almost no gap, and is hollow; however, the present invention is not limited thereto, and the coil C may have a quadrangular cross section, an elliptical cross section, or the like, and a superconducting wire may be wound around the core material or a bobbin formed of some nonmagnetic material. The superconducting wire may be wound without a gap or may be wound with a predetermined gap. The size and the number of turns of the coil C are not limited and are appropriately set according to the use purpose.

EXAMPLES

A description will be provided below of the results of confirmatory experiments conducted to confirm the effects of the present invention.

In these Examples, as laboratory experiments, a high-purity copper having a purity of 99.99 mass % or more and less than 99.9999 mass % and mother alloys of Ca, Sr, Ba, and rare earth elements were used as raw materials and adjusted to make the compositions in Table 1. With regard to Fe, Ni, As, Ag, Sn, Sb, Pb, Bi, P, and other impurities, a mother alloy of each element was prepared from Fe, Ni, As, Ag, Sn, Sb, Pb, Bi, and P having a purity of 99.9 mass % or more and pure copper having a purity of 99.9 mass %, and adjustment was carried out using these mother alloys. In alloy No. 17, mischmetal (MM) was added as the rare earth elements.

First, the high-purity copper was melted in a reducing gas atmosphere of $N_2$+CO using an electric furnace, then mother alloys of various additive elements and impurities were added thereto and adjusted to predetermined concentrations, and the results were cast in a predetermined mold to obtain ingots with a columnar shape having a diameter of 65 mm and a length of 180 mm. The ingots were subjected to hot-groove rolling at 840° C. to obtain hot rolled wire materials with a diameter of 8 mm and thin wires with a diameter of 2.0 mm were formed from the hot rolled wire material by cold drawing.

Wire materials for evaluation were manufactured by subjecting the thin wire to a heat treatment in an Ar gas atmosphere under conditions of being held for one hour at the heat treatment temperatures shown in Tables 2 to 4. In this Example, impurity elements mixed in during the melting and casting process was considered. Using these wire materials for evaluation, the following items were evaluated.

(Composition Analysis)

For elements excluding gas components, glow discharge mass spectrometry (GD-MS) was used in a case of elements of less than 10 ppm by mass, and inductively coupled plasma mass spectrometry (ICP-MS) was used in a case of elements of 10 ppm by mass or more. An infrared absorption method (IR) was used for the analysis of S and O. In GD-MS, a test piece having a length of 20 mm was prepared from a wire material for evaluation and, after pickling, the test piece was laid down and irradiated with a beam and the surface of the test piece was analyzed. By doing so, elements of a content of less than 10 ppm by mass were measured at the same time. In ICP-MS, a test piece having a length of 400 mm was prepared from a wire material for evaluation, and, after pickling, the test piece was completely dissolved and analysis was performed. By doing so, elements having a content of 10 ppm by mass or more were measured at the same time. In IR, a test piece having a length of 50 mm was prepared from a wire material for evaluation, and, after pickling, the test piece was completely dissolved and analysis was performed for each of S and O. The evaluation results are shown in Table 1.

(Vickers Hardness)

The Vickers hardness was measured with a micro Vickers hardness tester in accordance with JIS Z 2244: 2009 under conditions of a test force of 0.0051 N (50 g) and a holding time of 10 seconds. Specifically, a test piece with a length of 10 mm was prepared from the wire material for evaluation, embedded vertically in resin, the end face of the test piece was polished, the Vickers hardness was measured under the conditions described above at a total of five points, which were the center point of the obtained end face and each central point of four radii extending from this center point at every 90° rotation angle, and the average value thereof was determined. The evaluation results are shown in Tables 2 to 4.

(Half-Softening Temperature)

A sample for measurement was taken from the wire after cold wire drawing, the Vickers hardness at room temperature was measured with the same method as described above, the heat treatment temperature was defined at intervals of 25° C. from 50° C. to 500° C., the sample was rapidly cooled after being held at the heat treatment temperature for one hour in an Ar gas atmosphere, and the Vickers hardness at room temperature was measured with the same method as described above. A graph of the Vickers hardness at room temperature and the heat treatment temperature before rapid cooling was prepared and the half-softening temperature was determined from the obtained graph. The evaluation results are shown in Table 1.

(Residual Resistance Ratio (RRR))

Using the four-terminal method, the electrical resistivity ($\rho_{293K}$) at 293K and the electrical resistivity ($\rho_{4.2K}$) at the temperature of liquid helium (4.2 K) were measured, and RRR=$\rho_{293K}/\rho_{4.2K}$ was calculated. Specifically, a test piece having a length of 200 mm was prepared from the wire material for evaluation, and, after pickling, the electrical resistivity ($\rho_{293K}$) and the electrical resistivity ($\rho_{4.2K}$) were measured under the condition that the distance between terminals (distance between terminals on the inside in the four-terminal method) was 100 mm and RRR=$\rho_{293K}/\rho_{4.2K}$ was calculated. The evaluation results are shown in Tables 2 to 4.

(Compound Particle Observation)

Figure 5A:
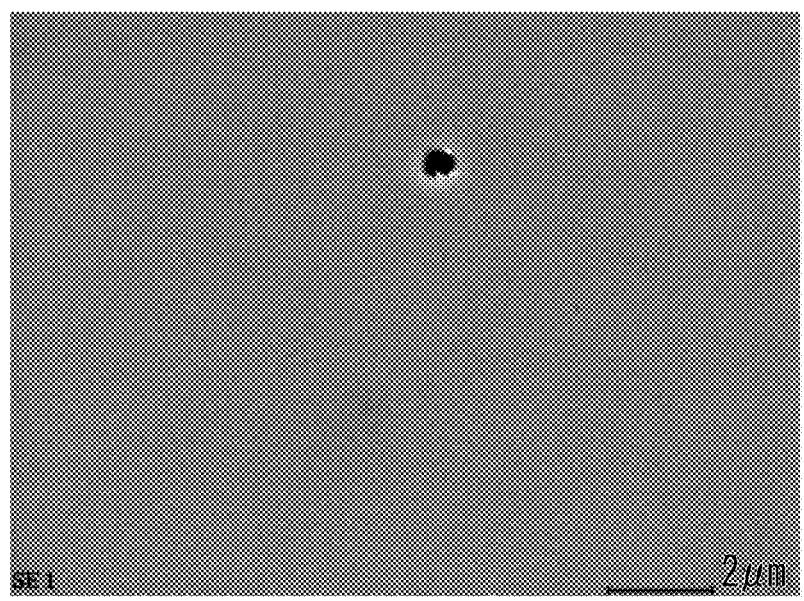
FIG. 5A is a photograph showing SEM observation results of a superconductivity stabilizing material of Example 2 of the present invention.
Figure 5B:
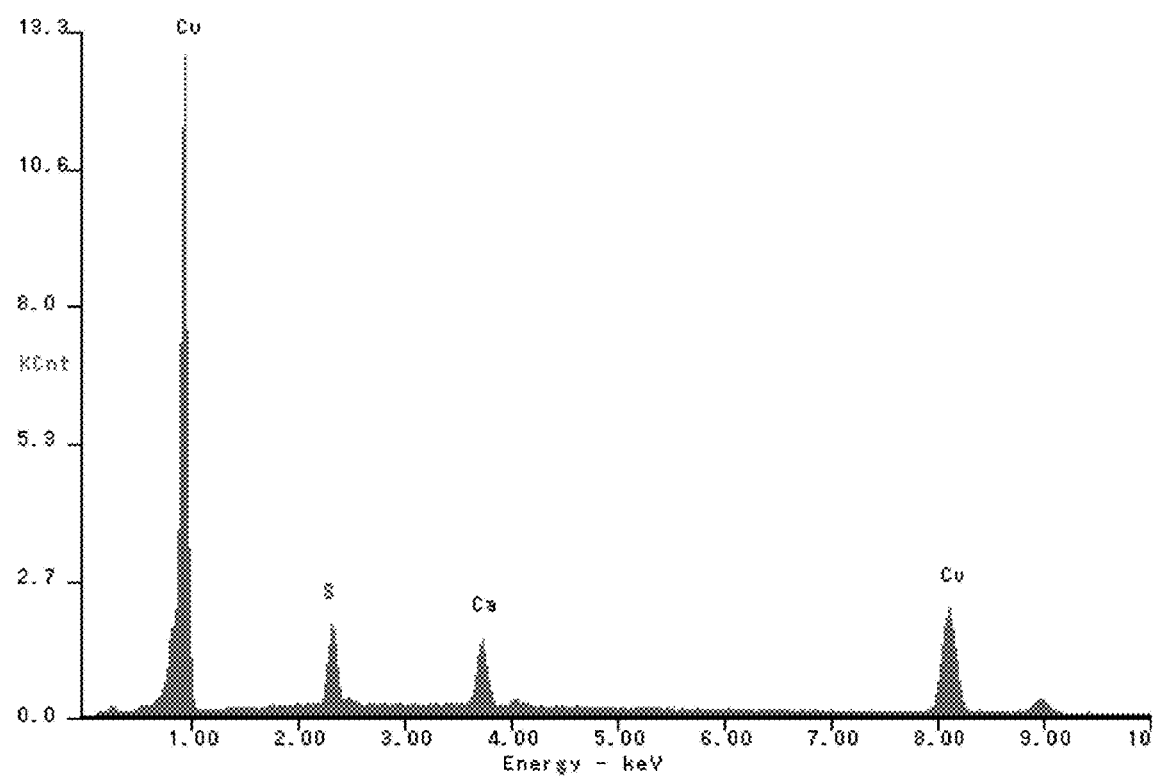
FIG. 5B is a graph showing analysis results of the superconductivity stabilizing material of Example 2 of the present invention.
Figure 6A:
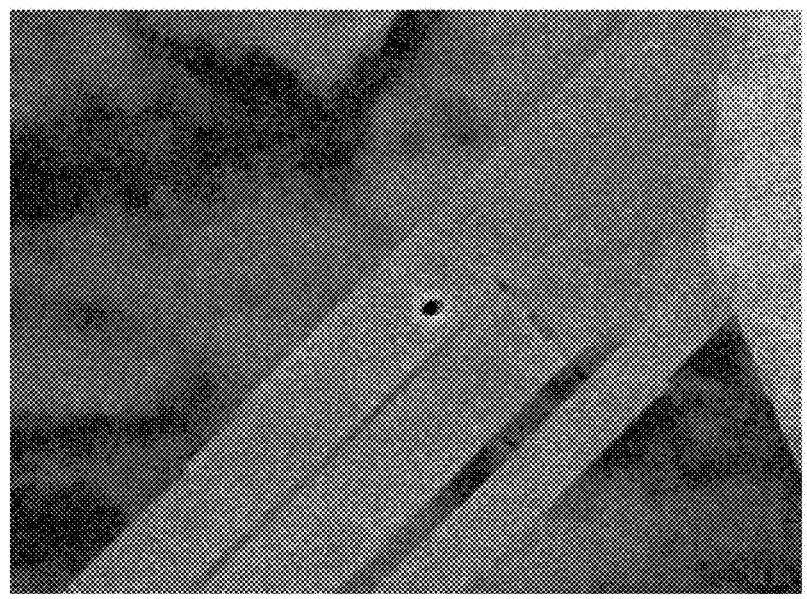
FIG. 6A is a photograph showing SEM observation results of a superconductivity stabilizing material of Example 14 of the present invention.
Figure 6B:
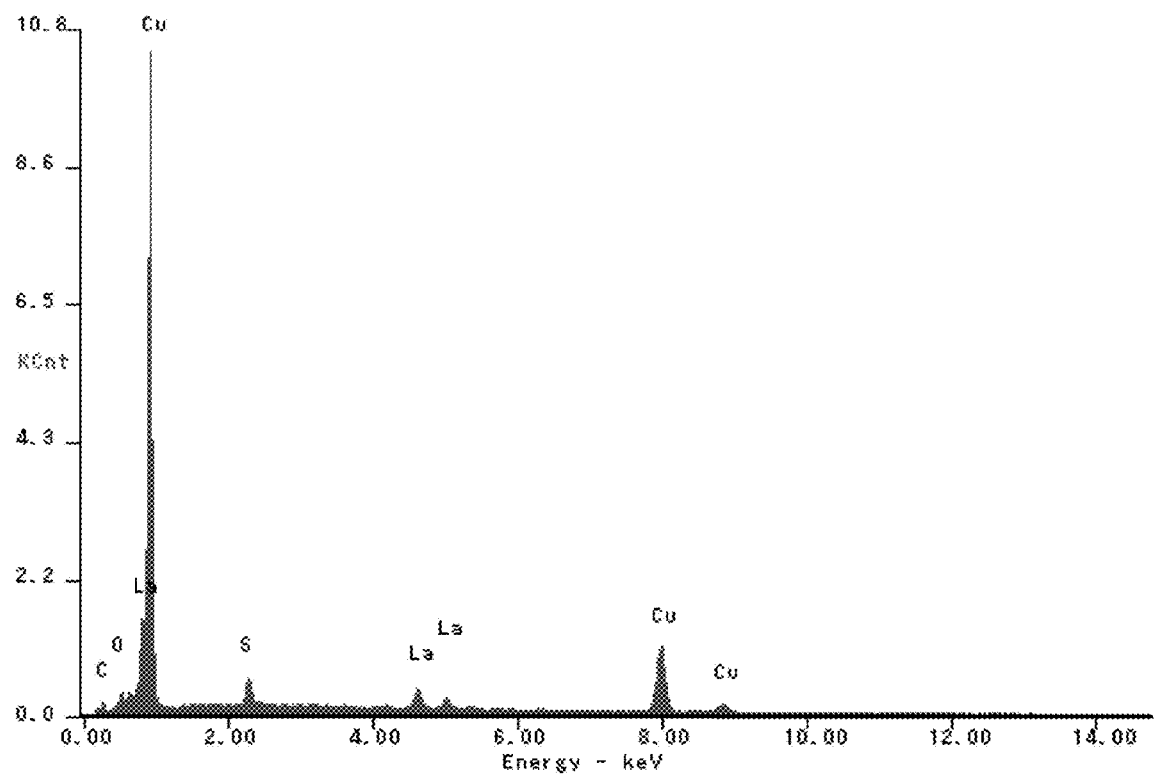
FIG. 6B is a graph showing analysis results of the superconductivity stabilizing material of Example 14 of the present invention.

In order to confirm the presence or absence of compound particles including at least one of additive elements selected from Ca, Sr, Ba, and rare earth elements and at least one element selected from S, Se, and Te, the particles were observed using a SEM (scanning electron microscope) and EDX analysis (energy dispersive X-ray spectroscopy) of the compound particles was performed. The SEM observation results of the compound of Example 2 of the present invention are shown in FIG. 5A and the EDX analysis results are shown in FIG. 5B. The SEM observation results of the compound of Example 14 of the present invention are shown in FIG. 6A and the EDX analysis results are shown in FIG. 6B.

TABLE 1

| Alloy No. | Additive elements (ppm by mass) | | | | Total concentration Y of Ca, Sr, Ba, RE | Impurities (ppm by mass) | | | | | | | | | | | | | | | | Y/X | Half-softening temperature (° C.) |
|---|---|---|---|---|---|---|---|---|---|---|---|---|---|---|---|---|---|---|---|---|---|---|---|
| | | | | | | Total concentration of unavoidable impurities excluding O,H, C, N, S | | Total concentration X of S, Se, Te | | | Specific impurities | | | | | | | | | | | | |
| | Ca | Sr | Ba | RE | | | S | Se | Te | | Fe | Ni | As | Ag | Sn | Sb | Pb | Bi | P | Cu | | |
| 1 | 3 | — | — | — | 3 | 73 | 3.4 | 2.0 | 1.2 | 6.6 | 7.0 | 5.5 | 4.3 | 32 | 2.1 | 3.0 | 2.9 | 1.1 | 1.8 | Remainder | 0.5 | 199 |
| 2 | 13 | — | — | — | 13 | 35 | 2.3 | 1.6 | 0.8 | 4.7 | 6.6 | 2.6 | 2.8 | 6 | 2.6 | 2.1 | 3.2 | 1.2 | 0.3 | Remainder | 2.8 | 138 |
| 3 | 22 | — | — | — | 22 | 66 | 3.4 | 1.0 | 0.9 | 5.3 | 3.9 | 8.3 | 2.1 | 34 | 2.3 | 2.3 | 1.5 | 0.1 | 0.3 | Remainder | 4.2 | 135 |
| 4 | 49 | — | — | — | 49 | 46 | 8.1 | 2.6 | 2.9 | 13.6 | 4.8 | 4.0 | 2.1 | 6 | 2.1 | 3.3 | 1.6 | 1.2 | 2.9 | Remainder | 3.6 | 111 |
| 5 | 76 | — | — | — | 76 | 43 | 2.1 | 1.3 | 1.2 | 4.6 | 7.5 | 1.6 | 3.3 | 16 | 1.9 | 2.4 | 1.3 | 0.1 | 0.2 | Remainder | 17.0 | 109 |
| 6 | 99 | — | — | — | 99 | 89 | 6.5 | 1.1 | 1.4 | 9.0 | 6.1 | 2.7 | 3.7 | 49 | 1.8 | 2.3 | 5.5 | 0.2 | 0.4 | Remainder | 11.0 | 163 |
| 7 | — | 9 | — | — | 9 | 53 | 4.2 | 1.9 | 0.6 | 6.7 | 5.3 | 5.5 | 2.5 | 21 | 1.3 | 1.9 | 1.4 | 1.6 | 1.2 | Remainder | 1.3 | 159 |
| 8 | — | 34 | — | — | 34 | 30 | 2.9 | 2.1 | 0.9 | 5.9 | 2.4 | 2.3 | 2.9 | 7 | 1.8 | 2.3 | 2.6 | 0.1 | 0.2 | Remainder | 5.8 | 133 |
| 9 | — | 68 | — | — | 68 | 76 | 3.1 | 0.8 | 0.9 | 4.8 | 5.9 | 6.5 | 4.4 | 39 | 3.5 | 2.1 | 2.3 | 0.1 | 0.3 | Remainder | 14.0 | 111 |
| 10 | — | 89 | — | — | 89 | 87 | 7.2 | 0.4 | 0.5 | 8.1 | 9.1 | 8.1 | 1.3 | 43 | 2.4 | 2.5 | 4.3 | 0.3 | 0.3 | Remainder | 11.0 | 136 |
| 11 | — | — | 4 | — | 4 | 50 | 0.9 | 0.3 | 0.3 | 1.5 | 2.3 | 1.6 | 2.5 | 29 | 2.6 | 2.7 | 1.8 | 0.3 | 1.5 | Remainder | 2.7 | 159 |
| 12 | — | — | 21 | — | 21 | 58 | 2.2 | 0.9 | 1.1 | 4.2 | 3.3 | 4.2 | 2.6 | 32 | 2.5 | 1.3 | 1.9 | 0.2 | 0.2 | Remainder | 5.0 | 137 |
| 13 | — | — | 55 | — | 55 | 38 | 9.3 | 0.2 | 1.5 | 11.0 | 3.6 | 2.6 | 2.9 | 7 | 2.2 | 2.1 | 2.1 | 0.4 | 0.2 | Remainder | 5.0 | 119 |
| 14 | — | — | — | La:29 | 29 | 52 | 4.2 | 2.6 | 0.7 | 7.5 | 7.5 | 2.9 | 4.2 | 15 | 1.8 | 2.0 | 2.6 | 1.1 | 2.8 | Remainder | 3.9 | 135 |
| 15 | — | — | — | Ce:45 | 45 | 57 | 4.5 | 0.8 | 1.6 | 6.9 | 4.2 | 7.3 | 1.3 | 26 | 2.4 | 1.3 | 1.0 | 0.6 | 0.5 | Remainder | 6.5 | 112 |
| 16 | — | — | — | Nd:32 | 32 | 60 | 3.9 | 1.6 | 1.2 | 6.7 | 5.6 | 1.6 | 1.6 | 34 | 1.7 | 1.3 | 1.3 | 0.2 | 0.3 | Remainder | 4.8 | 114 |
| 17 | — | — | — | MM:47 | 47 | 45 | 3.2 | 1.2 | 0.9 | 5.3 | 5.1 | 1.8 | 2.1 | 16 | 3.3 | 3.9 | 1.3 | 1.9 | 0.2 | Remainder | 8.9 | 110 |
| 18 | 22 | — | 12 | — | 34 | 29 | 2.6 | 0.5 | 1.1 | 4.2 | 2.3 | 5.5 | 2.3 | 7 | 1.3 | 2.4 | 1.2 | 0.3 | 0.2 | Remainder | 8.1 | 132 |
| 19 | 5 | 8 | 9 | — | 22 | 47 | 2.2 | 0.1 | 0.2 | 2.5 | 2.0 | 2.3 | 3.1 | 26 | 1.3 | 2.6 | 2.2 | 0.3 | 0.3 | Remainder | 8.8 | 137 |
| 101 | — | — | — | — | 0 | 48 | 4.0 | 2.2 | 2.3 | 8.5 | 7.2 | 3.4 | 0.8 | 15 | 1.1 | 2.5 | 4.2 | 0.5 | 0.5 | Remainder | 0.0 | 224 |
| 102 | — | 12 | 48 | — | 60 | 153 | 5.2 | 1.1 | 0.6 | 6.9 | 4.6 | 16 | 8.8 | 72 | 4.4 | 8.2 | 6.6 | 4.2 | 7.2 | Remainder | 8.7 | 232 |

TABLE 1-continued

| Alloy No. | Additive elements (ppm by mass) | | | | Total concentration Y of Ca, Sr, Ba, RE | Impurities (ppm by mass) | | | | | | | | | | | | | | Y/X | Half-softening temperature (° C.) |
|---|---|---|---|---|---|---|---|---|---|---|---|---|---|---|---|---|---|---|---|---|---|
| | Ca | Sr | Ba | RE | | Total concentration of unavoidable impurities excluding O,H, C, N, S | Total concentration X of S, Se, Te | Specific impurities | | | | | | | | | | | | | |
| | | | | | | | | S | Se | Te | Fe | Ni | As | Ag | Sn | Sb | Pb | Bi | P | Cu | | |
| 103 | 506 | — | — | — | 506 | 96 | 4.4 5.3 3.3 | 13.0 | | | 2.9 | 11 | 8.9 | 32 | 2.3 | 5.2 | 6.3 | 4.3 | 1.6 | Remainder | 39.0 | — |

TABLE 2

| | Alloy | Heat treatment temperature (° C.) | Hardness (Hv) | RRR |
|---|---|---|---|---|
| Examples of the present invention | 1 Alloy No. 1 | 100 | 129 | 53 |
| | 2 Alloy No. 2 | 100 | 127 | 56 |
| | 3 Alloy No. 3 | 100 | 126 | 57 |
| | 4 Alloy No. 4 | 100 | 113 | 58 |
| | 5 Alloy No. 5 | 100 | 103 | 65 |
| | 6 Alloy No. 6 | 100 | 129 | 54 |
| | 7 Alloy No. 7 | 100 | 128 | 54 |
| | 8 Alloy No. 8 | 100 | 115 | 58 |
| | 9 Alloy No. 9 | 100 | 112 | 62 |
| | 10 Alloy No. 10 | 100 | 126 | 57 |
| | 11 Alloy No. 11 | 100 | 129 | 54 |
| | 12 Alloy No. 12 | 100 | 127 | 57 |
| | 13 Alloy No. 13 | 100 | 125 | 58 |
| | 14 Alloy No. 14 | 100 | 125 | 57 |
| | 15 Alloy No. 15 | 100 | 113 | 58 |
| | 16 Alloy No. 16 | 100 | 113 | 58 |
| | 17 Alloy No. 17 | 100 | 108 | 64 |
| | 18 Alloy No. 18 | 100 | 126 | 58 |
| | 19 Alloy No. 19 | 100 | 127 | 57 |
| | 21 Alloy No. 1 | 125 | 129 | 56 |
| | 22 Alloy No. 2 | 125 | 116 | 59 |
| | 23 Alloy No. 3 | 125 | 107 | 64 |
| | 24 Alloy No. 4 | 125 | 74 | 73 |
| | 25 Alloy No. 5 | 125 | 71 | 80 |
| | 26 Alloy No. 6 | 125 | 125 | 57 |
| | 27 Alloy No. 7 | 125 | 125 | 57 |
| | 28 Alloy No. 8 | 125 | 92 | 70 |
| | 29 Alloy No. 9 | 125 | 72 | 77 |
| | 30 Alloy No. 10 | 125 | 107 | 64 |
| | 31 Alloy No. 11 | 125 | 127 | 57 |
| | 32 Alloy No. 12 | 125 | 114 | 63 |
| | 33 Alloy No. 13 | 125 | 97 | 70 |
| | 34 Alloy No. 14 | 125 | 104 | 67 |
| | 35 Alloy No. 15 | 125 | 74 | 75 |
| | 36 Alloy No. 16 | 125 | 84 | 73 |
| | 37 Alloy No. 17 | 125 | 71 | 78 |
| | 38 Alloy No. 18 | 125 | 97 | 70 |
| | 39 Alloy No. 19 | 125 | 112 | 63 |

TABLE 3

| | Alloy | Heat treatment temperature (° C.) | Hardness (Hv) | RRR |
|---|---|---|---|---|
| Examples of the present invention | 41 Alloy No. 1 | 150 | 127 | 70 |
| | 42 Alloy No. 2 | 150 | 81 | 96 |
| | 43 Alloy No. 3 | 150 | 78 | 150 |
| | 44 Alloy No. 4 | 150 | 65 | 287 |
| | 45 Alloy No. 5 | 150 | 61 | 389 |
| | 46 Alloy No. 6 | 150 | 107 | 72 |
| | 47 Alloy No. 7 | 150 | 104 | 73 |
| | 48 Alloy No. 8 | 150 | 74 | 247 |
| | 49 Alloy No. 9 | 150 | 62 | 299 |
| | 50 Alloy No. 10 | 150 | 78 | 151 |
| | 51 Alloy No. 11 | 150 | 103 | 74 |
| | 52 Alloy No. 12 | 150 | 79 | 148 |
| | 53 Alloy No. 13 | 150 | 75 | 210 |
| | 54 Alloy No. 14 | 150 | 76 | 158 |
| | 55 Alloy No. 15 | 150 | 62 | 297 |
| | 56 Alloy No. 16 | 150 | 65 | 285 |
| | 57 Alloy No. 17 | 150 | 61 | 312 |
| | 58 Alloy No. 18 | 150 | 74 | 247 |
| | 59 Alloy No. 19 | 150 | 79 | 148 |
| | 61 Alloy No. 1 | 175 | 117 | 74 |
| | 62 Alloy No. 2 | 175 | 69 | 144 |
| | 63 Alloy No. 3 | 175 | 66 | 225 |
| | 64 Alloy No. 4 | 175 | 60 | 431 |
| | 65 Alloy No. 5 | 175 | 55 | 499 |
| | 66 Alloy No. 6 | 175 | 79 | 95 |
| | 67 Alloy No. 7 | 175 | 74 | 107 |
| | 68 Alloy No. 8 | 175 | 63 | 371 |
| | 69 Alloy No. 9 | 175 | 59 | 449 |
| | 70 Alloy No. 10 | 175 | 65 | 227 |
| | 71 Alloy No. 11 | 175 | 71 | 102 |
| | 72 Alloy No. 12 | 175 | 67 | 222 |
| | 73 Alloy No. 13 | 175 | 64 | 315 |
| | 74 Alloy No. 14 | 175 | 65 | 237 |
| | 75 Alloy No. 15 | 175 | 59 | 446 |
| | 76 Alloy No. 16 | 175 | 61 | 428 |
| | 77 Alloy No. 17 | 175 | 57 | 468 |
| | 78 Alloy No. 18 | 175 | 63 | 371 |
| | 79 Alloy No. 19 | 175 | 67 | 222 |

TABLE 4

| | Alloy | Heat treatment temperature (° C.) | Hardness (Hv) | RRR |
|---|---|---|---|---|
| Comparative Examples | 1 Alloy No. 1 | 500 | 49 | 250 |
| | 2 Alloy No. 2 | 500 | 49 | 448 |
| | 3 Alloy No. 3 | 500 | 49 | 452 |
| | 4 Alloy No. 4 | 500 | 48 | 550 |
| | 5 Alloy No. 5 | 500 | 49 | 721 |
| | 6 Alloy No. 6 | 500 | 49 | 325 |
| | 7 Alloy No. 7 | 500 | 47 | 342 |
| | 8 Alloy No. 8 | 500 | 47 | 525 |
| | 9 Alloy No. 9 | 500 | 48 | 621 |
| | 10 Alloy No. 10 | 500 | 48 | 457 |
| | 11 Alloy No. 11 | 500 | 49 | 375 |
| | 12 Alloy No. 12 | 500 | 47 | 481 |
| | 13 Alloy No. 13 | 500 | 49 | 515 |
| | 14 Alloy No. 14 | 500 | 47 | 488 |
| | 15 Alloy No. 15 | 500 | 47 | 578 |
| | 16 Alloy No. 16 | 500 | 49 | 532 |

TABLE 4-continued

| Alloy | Heat treatment temperature (° C.) | Hardness (Hv) | RRR |
|---|---|---|---|
| 17 Alloy No. 17 | 500 | 47 | 637 |
| 18 Alloy No. 18 | 500 | 49 | 534 |
| 19 Alloy No. 19 | 500 | 49 | 465 |
| 101 Alloy No. 101 | 100 | 135 | 43 |
| 102 Alloy No. 102 | 100 | 142 | 41 |
| 121 Alloy No. 101 | 125 | 136 | 46 |
| 122 Alloy No. 102 | 125 | 141 | 44 |
| 141 Alloy No. 101 | 150 | 134 | 48 |
| 142 Alloy No. 102 | 150 | 142 | 43 |
| 161 Alloy No. 101 | 175 | 134 | 44 |
| 162 Alloy No. 102 | 175 | 142 | 45 |
| 181 Alloy No. 101 | 500 | 48 | 220 |
| 182 Alloy No. 102 | 500 | 47 | 164 |

Comparative Examples 1 to 19 used alloys No. 1 to 19, which were in the composition range of the present invention; however, since the heat treatment temperature was a high temperature at 500° C., the Vickers hardness was less than 50 Hv.

In alloy No. 101 to which at least one of additive elements selected from Ca, Sr, Ba, and rare earth elements were not added, the half-softening temperature exceeded 200° C. The residual resistance ratio (RRR) was less than 50 in all of Comparative Example 101 with a heat treatment temperature of 100° C., Comparative Example 121 with a heat treatment temperature of 125° C., Comparative Example 141 with a heat treatment temperature of 150° C., and Comparative Example 161 with a heat treatment temperature of 175° C., all using alloy No. 101. In Comparative Example 181 using Alloy No. 101, in which the heat treatment temperature was 500° C., the Vickers hardness was less than 50 Hv.

In alloy No. 102, in which the total concentration of unavoidable impurities, excluding O, H, C, N, and S, which are gas components, exceeded 100 ppm by mass, the half-softening temperature exceeded 200° C. The residual resistance ratio (RRR) was less than 50 in all of Comparative Example 102 with a heat treatment temperature of 100° C., Comparative Example 122 with a heat treatment temperature of 125° C., Comparative Example 142 with a heat treatment temperature of 150° C., and Comparative Example 162 with a heat treatment temperature of 175° C., all using Alloy No. 102. In Comparative Example 182 using Alloy No. 102, in which the heat treatment temperature was set to 500° C., the Vickers hardness was less than 50 Hv.

In Alloy No. 103, in which the addition amount of Ca was 506 ppm by mass which exceeded the range of the present invention, cracking occurred during plastic working. For this reason, subsequent evaluation was stopped.

In contrast, in Alloys No. 1 to 19, which were in the composition range of the present invention, the half-softening temperature was 200° C. or lower. It was confirmed that the Vickers hardness was 50 Hv or more and the residual resistance ratio (RRR) was in a range of 50 or more and 500 or less in Examples 1 to 19 of the present invention in which the heat treatment temperature was 100° C., Examples 21 to 39 of the present invention in which the heat treatment temperature was 125° C., Examples 41 to 59 of the present invention in which the heat treatment temperature was 150° C., and Examples 61 to 79 of the present invention in which the heat treatment temperature was 175° C., all using Alloys No. 1 to 19.

As shown in FIG. 5A to FIG. 6B, in the Examples of the present invention, it was confirmed that compound particles including at least one of additive elements selected from Ca, Sr, Ba, and rare earth elements and at least one of elements selected from S, Se, and Te were present.

From the above, according to the Examples of the present invention, it was confirmed that it is possible to provide a superconductivity stabilizing material which has low recrystallization temperature and high hardness and which is suitable for use in an environment with a high magnetic field.

INDUSTRIAL APPLICABILITY

According to the present invention, it is possible to provide a superconductivity stabilizing material which has low recrystallization temperature and high hardness and which is suitable for use in an environment with a high magnetic field, a superconducting wire provided with this superconductivity stabilizing material, and a superconducting coil formed of this superconducting wire. Therefore, it is possible to use the present invention in industry.

Reference Signs List 10, 110, 210 SUPERCONDUCTING WIRE
20, 120 SUPERCONDUCTIVITY STABILIZING MATERIAL
C SUPERCONDUCTING COIL

What is claimed is:

1. A superconductivity stabilizing material used for a superconducting wire, consisting of:
a copper material, wherein
the copper material comprises;
at least one of additive elements selected from Ca, Sr, Ba, and rare earth elements in a range of 3 ppm by mass or more and 100 ppm by mass or less in total, and
a remainder being Cu and unavoidable impurities,
a total concentration of the unavoidable impurities, excluding O, H, C, N, and S which are gas components, is 5 ppm by mass or more and 100 ppm by mass or less,
half-softening temperature is 200° C. or lower,
Vickers hardness is 55 Hv or more, and
residual resistance ratio (RRR) is 50 or more and 500 or less.

2. The superconductivity stabilizing material according to claim 1, wherein
as the unavoidable impurities, the content of Fe is 10 ppm by mass or less, the content of Ni is 10 ppm by mass or less, the content of As is 5 ppm by mass or less, the content of Ag is 50 ppm by mass or less, the content of Sn is 4 ppm by mass or less, the content of Sb is 4 ppm by mass or less, the content of Pb is 6 ppm by mass or less, the content of Bi is 2 ppm by mass or less, and the content of P is 3 ppm by mass or less.

3. The superconductivity stabilizing material according to claim 1, wherein
the copper material further comprises at least one of elements selected from S, Se, and Te, and
a ratio Y/X of the total content (Y ppm by mass) of the at least one of additive elements selected from Ca, Sr, Ba, and rare earth elements to the total content (X ppm by mass) of the at least one of elements selected from S, Se, and Te is in a range of 0.5Y/X20.

4. The superconductivity stabilizing material according to claim 1, wherein
the copper material further comprises at least one of elements selected from S, Se, and Te, and at least one compound including the at least one of additive elements selected from Ca, Sr, Ba, and rare earth elements and the at least one of elements selected from S, Se, and Te is present.

5. A superconducting wire comprising:
a strand including a superconducting material; and
the superconductivity stabilizing material according to claim 1.

6. A superconducting coil having a structure provided with a winding section in which the superconducting wire according to claim 5 is wound around a peripheral surface of a winding frame.

* * * * *